(12) United States Patent
Yun

(10) Patent No.: US 7,781,252 B2
(45) Date of Patent: Aug. 24, 2010

(54) METHOD OF MANUFACTURING CMOS IMAGE SENSOR

(75) Inventor: Jun Han Yun, Seoul (KR)

(73) Assignee: Dongby Hitek Co., Ltd., Seoul (KR)

( * ) Notice: Subject to any disclaimer, the term of this patent is extended or adjusted under 35 U.S.C. 154(b) by 272 days.

(21) Appl. No.: 11/933,942

(22) Filed: Nov. 1, 2007

(65) Prior Publication Data

US 2008/0160662 A1 Jul. 3, 2008

(30) Foreign Application Priority Data

Dec. 29, 2006 (KR) .................. 10-2006-0137295

(51) Int. Cl.
*H01L 21/00* (2006.01)
*G02F 1/13* (2006.01)
(52) U.S. Cl. .................. 438/70; 349/199; 438/69; 438/71; 257/E31.127; 257/E27.127
(58) Field of Classification Search .................. 438/70, 438/57, 69, 71, 72; 349/199; 257/431, 432, 257/440, 443, 444, E31.127, E27.131, E27.134
See application file for complete search history.

(56) References Cited

U.S. PATENT DOCUMENTS

2006/0019425 A1* 1/2006 Su Kon .................. 438/70

* cited by examiner

*Primary Examiner*—Walter L Lindsay, Jr.
(74) *Attorney, Agent, or Firm*—Workman Nydegger

(57) ABSTRACT

A method of manufacturing a CMOS image sensor comprising forming a first insulating film on a silicon semiconductor substrate which includes a metal pad; selectively etching the first insulating film, so as to form a first insulating film pattern with a first opening which exposes the metal pad; forming a metal pad protective film in the first opening portion with a predetermined thickness; forming a second insulating film on the first insulating film pattern and metal pad protective film; selectively etching the second insulating film, so as to form a second insulating film pattern which includes a second opening which exposes the metal pad protective film; forming a color filter array (CFA) on the second insulating film pattern; forming micro lenses on the CFA; and performing an etching process in order to remove the metal pad protective film so as to form a metal pad opening.

9 Claims, 2 Drawing Sheets

METHOD OF MANUFACTURING CMOS IMAGE SENSOR

CROSS-REFERENCES AND RELATED APPLICATIONS

This application claims the benefit of Korean Patent Application No. 10-2006-0137295, filed on 29 Dec. 2006, which is hereby incorporated by reference in its entirety.

BACKGROUND OF THE INVENTION

1. Field of the Invention

The present invention relates to a method of manufacturing a CMOS image sensor. More particularly, the present invention relates to a method of manufacturing a CMOS image sensor which is capable of preventing the metal pad of a semiconductor device from corroding due to any residual material, such as a development solution, from the colored photoresist film process.

2. Discussion of the Related Art

In a color image sensor, color filters are arrayed on a photosensitive portion so as to receive external light, generate and store photocharges. A color filter array (CFA) is formed of three colors of red, green and blue or three colors of yellow, magenta and cyan.

An image sensor includes a photosensitive portion for sensing light and a logic circuit portion for converting the sensed light into an electrical signal so as to generate data. In order to increase photosensitivity, it has been attempted to increase the size of the photosensitive portion, however, since the logic circuit portion cannot be removed, this attempt has restricted due to the size constraints of the image sensor. Accordingly, in order to increase the photosensitivity, light-focusing technology is used to change the paths of any light beams which are directed regions outside photosensitive region so that the light beams are redirected to the area of the photosensitive portion. Typically, such light-focusing technology operates by forming micro lenses on the color filters.

A method of forming an image sensor known in the art typically comprises forming a field insulating film for electrical insulation between devices on a silicon substrate. Next, unit pixels including photosensitive regions of light-receiving elements are formed, followed by a metal interlayer insulating film, and a plurality of metal wiring.

In order to protect the device from being exposed to water or scratching, an oxide film and a nitride film are sequentially coated over the device so as to form a protective film, wherein the protective film is etched so as to form an area capable of forming an electrical connection with the device during the wire bonding process. Typically, this comprises forming a metal pad opening portion for exposing a portion of the metal pad. Later, a color filter array is formed such that the image sensor can capture a color image.

However, residual materials, such as development solution or the like, which are used during the photoresist film process may reach the exposed surface of the metal pad, causing corrosion, damage or contamination in the metal pad.

BRIEF SUMMARY OF THE INVENTION

Accordingly, the present invention is directed to a method of manufacturing a CMOS image sensor that substantially obviates one or more problems, limitations, or disadvantages of the related art.

An object of the present invention is to provide a method of manufacturing a CMOS image sensor, which is capable of preventing a metal pad of a semiconductor device from corroding after being exposed to a residual material, such as a development solution or the like, during a colored photoresist film process.

Additional advantages, objects, and features of the invention will be set forth in part in the description which follows and will become apparent to those having ordinary skill in the art or may be learned from practice of the invention. These objectives and other advantages of the invention may be realized and attained by using the structure particularly pointed out in the written description, claims, and appended drawings.

In order to achieve these objects and other advantages, one aspect of the invention is a method for manufacturing an image sensor comprising forming a first insulating film on a silicon semiconductor substrate which includes a metal pad, selectively etching the first insulating film in order to form a first insulating film pattern which includes a first opening portion for exposing a portion of the metal pad, forming a metal pad protective film in the first opening portion at a predetermined thickness, forming a second insulating film on the first insulating film pattern and metal pad protective film, selectively etching the second insulating film in order to form a second insulating film pattern including a second opening portion for exposing a portion of the metal pad protective film, forming a color filter array (CFA) on the second insulating film pattern, forming micro lenses on the CFA, and performing an etching process in order to remove the metal pad protective film to form a metal pad opening portion.

It is to be understood that both the foregoing general description and the following detailed description of the present invention are exemplary and explanatory and are intended to provide an explanation of the invention as claimed.

BRIEF DESCRIPTION OF THE DRAWINGS

The accompanying drawings are included to provide a further understanding of the invention and are incorporated in and constitute a part of this application. The drawings illustrate embodiment(s) of the invention and together with the description serve to explain the principle of the invention. In the drawings.

DETAILED DESCRIPTION OF THE INVENTION

Hereinafter, a method of manufacturing a CMOS image sensor according to the present invention will be described in detail with reference to the accompanying drawings.

Figure 1A:
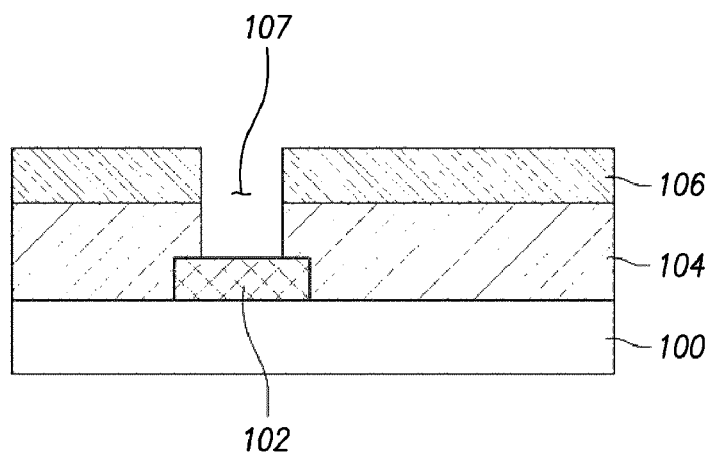
FIGS. 1A to 1D are cross-sectional views illustrating a method of manufacturing a CMOS mage sensor according to the present invention.

FIGS. 1A to 1D are cross-sectional views illustrating a method of manufacturing a CMOS image sensor according to the present invention. As shown in FIG. 1A, a first insulating film 104 is formed on a silicon semiconductor substrate 100. The substrate 100 includes a metal pad 102 formed of a material such as, for example, aluminum (Al) or copper (Cu). The first isolating film 104 is formed using a plasma enhanced chemical vapor deposition (PECVD) method, and a photoresist material is coated on the first insulating film 104 so as to form a first photoresist pattern 106.

In this example, the first insulating film 104 is preferably formed of a nitride film (SiN).

Thereafter, an etching process using the first photoresist pattern 106 as a mask is performed so as to selectively etch the first insulating film 104. Thus, the resulting first insulating film pattern 104 includes a first opening portion 107 for exposing the metal pad 102 is formed.

Figure 1B:
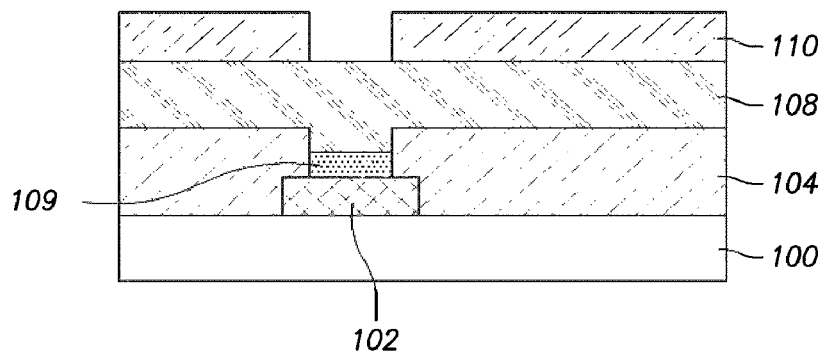

As shown in FIG. 1B, an ashing and cleaning process are performed to remove the first photoresist pattern 106, and a metal pad protective film 109 is formed in the first opening portion 107 of the first insulating film pattern 104 at a thickness of between 10 and 200 Å at a temperature 300 to 400° C. for 1 to 120 min.

In this example, the metal pad protective film 109 may comprise an oxide film ($SiO_2$).

Thereafter, a second insulating film 108 is formed on the first insulating film pattern 104 and metal pad protective film 109. Next, a photoresist material is coated on the second insulating film 108 and is formed into a second photoresist pattern 110.

In this example, the second oxide film 108 is preferably formed of an oxide ($SiO_2$) material.

Figure 1C:
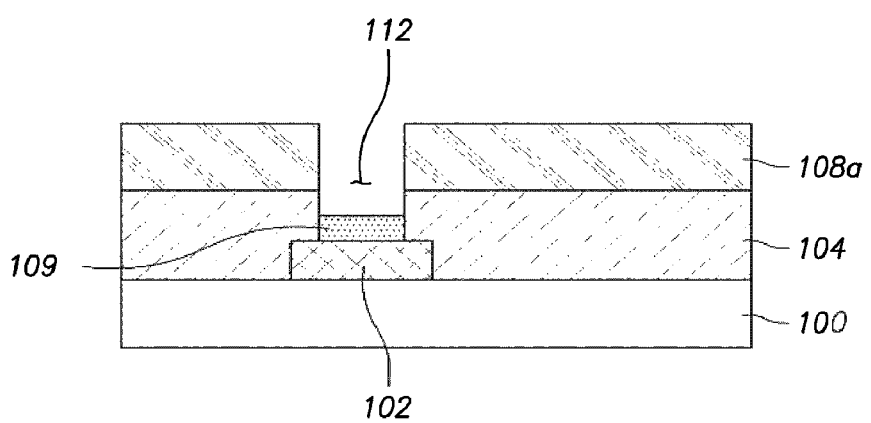

As shown in FIG. 1C, an etching process which uses the second photoresist pattern 110 as a mask is performed so as to selectively etch the second insulating film 108. Thus, a second insulating film pattern 108a which includes a second opening portion 112 for exposing a portion of the protective film 109 is formed. Next, an ashing and cleaning process are performed so as to remove the second photoresist pattern 110.

Figure 1D:
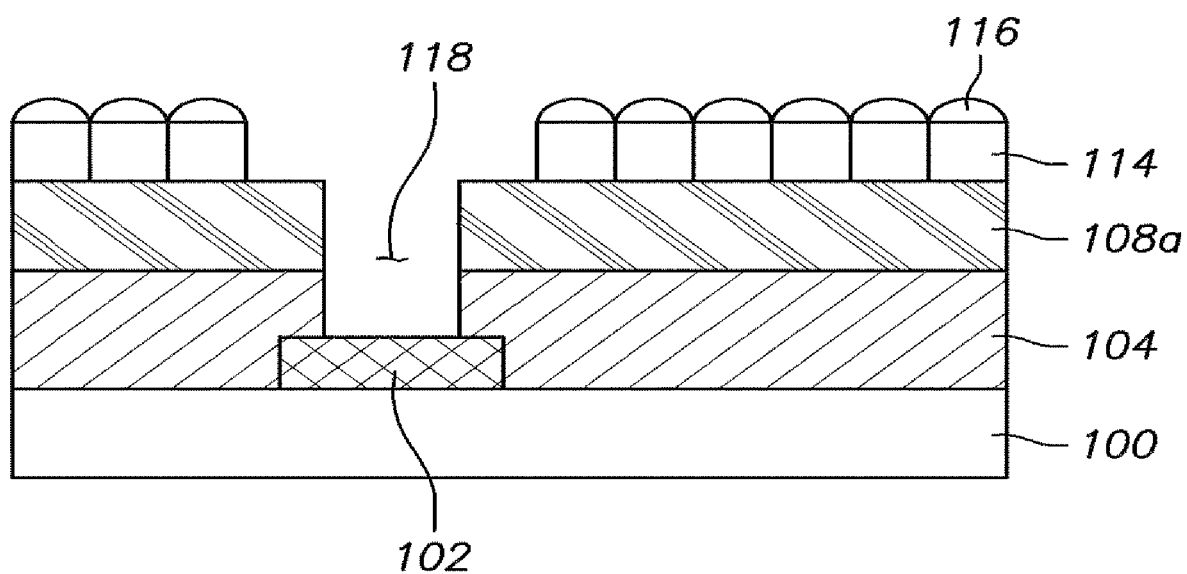

Then, as shown in FIG. 1D, resist layers of blue, red, and green are coated on the second insulating film pattern 108a and exposure and development processes are performed so as to form color filter layers 114 for filtering light according to the respective color wavelengths.

In this example the color filter layers 114 are formed by coating respective color resists and performing photolithographic etching processes using different masks.

Thereafter, semi-spherical micro lenses 116 corresponding to the color filter layers 114 are formed and the metal pad protective film 109 is removed using an etching process, such as a reactive ion etching (RIE) process, so as to form a metal pad opening portion 118.

As described above, in the method of manufacturing a CMOS image sensor according to the present invention, a protective film is formed on a metal pad in the metal pad opening portion, which prevents the surface of the metal pad from being exposed during the manufacturing process. Thus the surface of the metal pad can be prevented from being corroded, damaged or contaminated.

It will be apparent to those skilled in the art that various modifications and variations can be made to the present invention without departing from the spirit or scope of the invention. Thus, it is intended that the present invention covers any modifications and variations of this invention that come within the scope of the appended claims and their equivalents.

What is claimed is:

1. A method of manufacturing a CMOS image sensor, the method comprising:
    forming a first insulating film on a silicon semiconductor substrate which includes a metal pad;
    selectively etching the first insulating film in order to form a first insulating film pattern which includes a first opening portion which exposes a portion of the metal pad;
    forming a metal pad protective film in the first opening portion with a predetermined thickness;
    forming a second insulating film over the first insulating film pattern and metal pad protective film;
    selectively etching the second insulating film in order to form a second insulating film pattern which includes a second opening portion which exposes a portion of the metal pad protective film;
    forming a color filter array (CFA) on the second insulating film pattern;
    forming micro lenses on the CFA; and
    performing an etching process to remove the metal pad protective film, so as to form a metal pad opening portion; wherein the metal pad protective film is formed of an oxide film ($SiO_2$) with a thickness of between 10 and 200 .ANG and is formed at a temperature of between 300 and 400 degree for between 1 and 120 min.

2. A method of manufacturing a CMOS image sensor, the method comprising:
    forming a first insulating film on a silicon semiconductor substrate which includes a metal pad;
    selectively etching the first insulating film in order to form a first insulating film pattern which includes a first opening portion which exposes a portion of the metal pad;
    forming a metal pad protective film in the first opening portion with a predetermined thickness;
    forming a second insulating film over the first insulating film pattern and metal pad protective film;
    selectively etching the second insulating film in order to form a second insulating film pattern which includes a second opening portion which exposes a portion of the metal pad protective film;
    forming a color filter array (CFA) on the second insulating film pattern;
    forming micro lenses on the CFA; and
    performing an etching process to remove the metal pad protective film, so as to form a metal pad opening portion; wherein the forming of the first insulating film pattern comprises:
    coating a photoresist material on the first insulating film and forming it into a first photoresist pattern; and
    performing a selective etching process using the first photoresist pattern as a mask to etch the first insulating film, so as to form the first insulating film pattern with a first opening portion for exposing the metal pad.

3. The method according to claim 1, wherein the forming of the second insulating film pattern comprises:
    coating a photoresist material on the second insulating film and forming the photoresist material into a pattern; and
    performing an etching process using the second photoresist pattern as a mask, so as to form a second insulating film pattern with a second opening portion for exposing a portion of the metal pad protective film.

4. A method of manufacturing a CMOS image sensor, the method comprising;
    forming a first insulating film on a silicon semiconductor substrate which includes a metal pad;
    selectively etching the first insulating film in order to form a first insulating film pattern which includes a first opening portion which exposes a portion of the metal pad;
    forming a metal pad protective film in the first opening portion with a predetermined thickness;
    forming a second insulating film over the first insulating film pattern and metal pad protective film;
    selectively etching the second insulating film in order to form a second insulating film pattern which includes a second opening portion which exposes a portion of the metal pad protective film;
    forming a color filter array (CFA) on the second insulating film pattern;
    forming micro lenses on the CFA; and
    performing an etching process to remove the metal pad protective film, so as to form a metal pad opening portion; wherein the first insulating film is formed of a silicon nitride film (SiN) and the second insulating film is formed of a silicon oxide film (SiO.sub.2).

5. A method of manufacturing a CMOS image sensor, the method: forming a first insulating film on a silicon semiconductor substrate which includes a metal pad;

selectively etching the first insulating film in order to form a first insulating film pattern which includes a first opening portion which exposes a portion of the metal pad;

forming a metal pad protective film in the first opening portion with a predetermined thickness;

forming a second insulating film over the first insulating film pattern and metal pad protective film;

selectively etching the second insulating film in order to form a second insulating film pattern which includes a second opening portion which exposes a portion of the metal pad protective film;

forming a color filter array (CFA) on the second insulating film pattern;

forming micro lenses on the CFA; and performing an etching process to remove the metal pad protective film, so as to form a metal pad opening portion; wherein the etching process etches the metal pad protective film using a reactive ion etching (RIE) process.

6. A method of manufacturing a CMOS image sensor, the method comprising:

forming a first insulating film on a silicon semiconductor substrate which includes a metal pad;

coating a photoresist material on the first insulating film and forming the photoresist material into a first photoresist pattern;

etching the first insulating film using the first photoresist pattern as a mask, so as to form a first insulating film pattern with a first opening portion for exposing the metal pad;

forming a metal pad protective film in the first opening portion with a predetermined thickness;

forming a second insulating film over the first insulating film pattern and metal pad protective film;

coating a photoresist material on the second insulating film and forming the photoresist material into a pattern;

etching the second insulating film using the second photoresist pattern as a mask, so as to form a second insulating film pattern with a second opening portion for exposing a portion of the metal pad protective film;

forming a color filter array (CFA) on the second insulating film pattern;

forming micro lenses on the CFA; and performing an etching process to remove the metal pad protective film, so as to form a metal pad opening portion.

7. The method according to claim 6, wherein the metal pad protective film is formed of an oxide film ($SiO_2$) with a thickness of between 10 and 200 Å and is formed at a temperature of between 300 and 400° for between 1 and 120 min.

8. The method according to claim 6, wherein the first insulating film is formed of a silicon nitride film (SiN) and the second insulating film is formed of a silicon oxide film ($SiO_2$).

9. The method according to claim 6, wherein the etching process etches the metal pad protective film using a reactive ion etching (RIE) process.

* * * * *